United States Patent
Tada (10) Patent No.: US 10,957,739 B2
(45) Date of Patent: Mar. 23, 2021

(54) RESISTANCE VARIATION ELEMENT, SEMICONDUCTOR DEVICE, AND MANUFACTURING METHOD

(71) Applicant: NEC Corporation, Tokyo (JP)

(72) Inventor: Munehiro Tada, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/470,617

(22) PCT Filed: Dec. 18, 2017

(86) PCT No.: PCT/JP2017/045263
§ 371 (c)(1),
(2) Date: Jun. 18, 2019

(87) PCT Pub. No.: WO2018/123678
PCT Pub. Date: Jul. 5, 2018

(65) Prior Publication Data
US 2020/0020743 A1      Jan. 16, 2020

(30) Foreign Application Priority Data

Dec. 27, 2016  (JP) .............................. JP2016-252480

(51) Int. Cl.
*H01L 27/24* (2006.01)
*H01L 21/8239* (2006.01)
*H01L 45/00* (2006.01)

(52) U.S. Cl.
CPC .......... *H01L 27/24* (2013.01); *H01L 21/8239* (2013.01); *H01L 45/1253* (2013.01); *H01L 45/1608* (2013.01)

(58) Field of Classification Search
CPC ........ A01N 43/08; A01N 25/12; A01N 25/30; A01N 43/56; A01N 51/00; H01L 27/24;
(Continued)

(56) References Cited

U.S. PATENT DOCUMENTS

2015/0340606 A1* 11/2015 Tada ................... H01L 27/2418
257/4
2017/0309817 A1* 10/2017 Sakamoto ........... H01L 45/1273

FOREIGN PATENT DOCUMENTS

JP       2005-101535 A     4/2005
JP       2011-146632 A     7/2011
(Continued)

OTHER PUBLICATIONS

Kaeriyama et al., "A Nonvolatile Programmable Solid-Electrolyte Nanometer Switch", IEEE Journal of Solid-State Circuits, Jan. 2005, vol. 40, No. 1, pp. 168-176 (total 9 pages).

(Continued)

*Primary Examiner* — Edward Chin (57) ABSTRACT

Provided is a resistance variation element including a resistance variation film of a metal depositing type, a first electrode which contacts with a first surface of the resistance variation film in a predetermined first region and supplies metallic ions via the first region, and a second electrode laminated on a second surface of the resistance variation film. The first region includes a recessed region surrounded by a simple closed curve or a region surrounded by a plurality of simple closed curves. A line segment which passes through a point outside of the first region, ends of which exist on the simple closed curve, and each point of which in the vicinity of both the ends other than both the ends is outside of the first region, exists, and an edge of the first electrode is formed in a part of the simple closed curve including both the ends.

10 Claims, 11 Drawing Sheets

(58) Field of Classification Search
CPC ............. H01L 21/8239; H01L 45/1253; H01L 45/1608; H01L 45/08
See application file for complete search history.

(56) References Cited

FOREIGN PATENT DOCUMENTS

| | | |
|---|---|---|
| JP | 2012-244017 A | 12/2012 |
| JP | 2013-168454 A | 8/2013 |
| JP | 2013-187503 A | 9/2013 |
| JP | 2015/182074 A1 | 12/2015 |
| WO | 2013/136798 A1 | 9/2013 |
| WO | 2014/057734 A1 | 4/2014 |
| WO | 2014/112365 A1 | 7/2014 |
| WO | 2016/084349 A1 | 6/2016 |

OTHER PUBLICATIONS

International Search Report for PCT/JP2017/045263 dated Feb. 20, 2018.
Written Opinion for PCT/JP2017/045263 dated Feb. 20, 2018 (PCT/ISA/237).

* cited by examiner

RESISTANCE VARIATION ELEMENT, SEMICONDUCTOR DEVICE, AND MANUFACTURING METHOD

This application is a National Stage Entry of PCT/JP2017/045263 filed on Dec. 18, 2017, which claims priority from Japanese Patent Application 2016-252480 filed on Dec. 27, 2016, the contents of all of which are incorporated herein by reference, in their entirety.

TECHNICAL FIELD

The present invention relates to a semiconductor device and a manufacturing method for the semiconductor device, more particularly, to a semiconductor device including a resistance variation non-volatile element (hereinafter, referred to as "resistance variation element") and a manufacturing method for the semiconductor device.

BACKGROUND ART

Integration and reduction in power for a semiconductor device, particularly, a silicon device have been promoted at a quadrupled speed for three years through microfabrication in accordance with a scaling law called Moore's law. However, in recent years, a gate length of a metal oxide semiconductor field effect transistor (MOSFET) has been reduced to 20 nm or smaller, and a steep rise in cost of a lithographic process, that is, a steep rise in price of a lithographic device and in price of a mask set for achieving the gate length is remarkable. In addition, due to a physical limit in device dimension, that is, an operation limit and increase in variation caused by microfabrication, it becomes impossible to achieve scaling in a conventional manner. In view of this, it is required to improve device performance with another method different from the scaling law.

In recent years, there has been developed a rewritable programmable logic device, which is called a field-programmable gate array (FPGA) placed between a gate array and a standard cell. The FPGA enables a user to switch a circuit structure after manufacturing the FPGA. It is expected that such switching of the circuit structure is performed with a switching element provided in a multilayer wiring layer. This is because a degree of freedom of the circuit structure can be improved and reduction in power consumption can be achieved when the FPGA is formed by using the switching element.

As a switching element preferred for the purpose of such switching of the circuit structure in the FPGA, there may be exemplified a resistance variation element, such as a resistance random access memory (ReRAM) using transition metal oxide, a solid electrolyte switch using an ion conductor, and an atomic switch. Note that the ion conductor is a solid electrolyte that enables ions to move about in an electric field.

PTL 1 and NPL 1 disclose a solid electrolyte switch (also referred to as a metallic crosslink-type resistance variation element) utilizing metallic crosslink (also referred to as a filament or a conductive path) formation acquired through metallic ion movement and electrochemical reaction in an ion conductor. The solid electrolyte switch disclosed in PTL 1 and NPL 1 includes an ion conductive layer, and a first electrode and a second electrode being provided oppositely across the ion conductive layer. Out of those, the first electrode is an electrode (referred to as an active electrode) that supplies metallic ions to the ion conductive layer, and the second electrode is an electrode (referred to as an inert electrode) that does not supply metallic ions to the ion conductive layer.

An operation of the solid electrolyte switch is described below. First, when the second electrode is grounded and positive voltage is applied to the first electrode, metal of the first electrode is turned into metallic ions and dissolved in the ion conductive layer. The metallic ions in the ion conductive layer receive electrons at the second electrode, and are turned into metal and deposited. With the deposited metal, a metallic crosslink connecting the first electrode and the second electrode with each other is formed in the ion conductive layer. By electrically connecting the first electrode and the second electrode with each other with the metallic crosslink, the switch is turned into an on state. An operation to acquire the on state is referred to as a set operation, and an applied voltage to acquire the on state is referred to as a set voltage.

Meanwhile, when the first electrode is grounded and positive voltage is applied to the second electrode in the on state, the metal being the metallic crosslink is turned into metallic ions and dissolved in the ion conductive layer, and a part of the metallic crosslink is interrupted. With this process, the first electrode and the second electrode are electrically disconnected, and the switch is turned into an off state. An operation to acquire the off state is referred to as a reset operation, and an applied voltage to acquire the off state is referred to as a reset voltage. Further, in order to switch from the off state to the on state, it is only required to ground the second electrode again and apply positive voltage to the first electrode.

Such a solid electrolyte switch is characterized with a smaller size and smaller on-resistance as compared to a semiconductor switch such as a MOSFET, and hence is considered to be suitable for application to a programmable logic device such as an FPGA. Further, the solid electrolyte switch is maintained in the on state or the off state without being applied with the voltage, and hence is applicable as a non-volatile memory element.

Further, as a solid electrolyte switch, PTL 2 discloses a unipolar type switch and a bipolar type switch. The unipolar type is a switch that performs resistance variation with a magnitude of applied voltage regardless of polarity of the applied voltage. Further, the bipolar type is a switch that performs resistance variation with a magnitude and polarity of applied voltage.

Reduction in switching voltage of the solid electrolyte switch described above and in fluctuation of the switching voltage is essential for high performance and reduction in power of a semiconductor device using the solid electrolyte switch. PTLs 2 to 5 disclose a technique of promoting ionization of the electrode metal and reducing the switching voltage and fluctuation thereof, by acquiring a shape of an electrode that an electric field is likely to be concentrated.

Figure 7A:
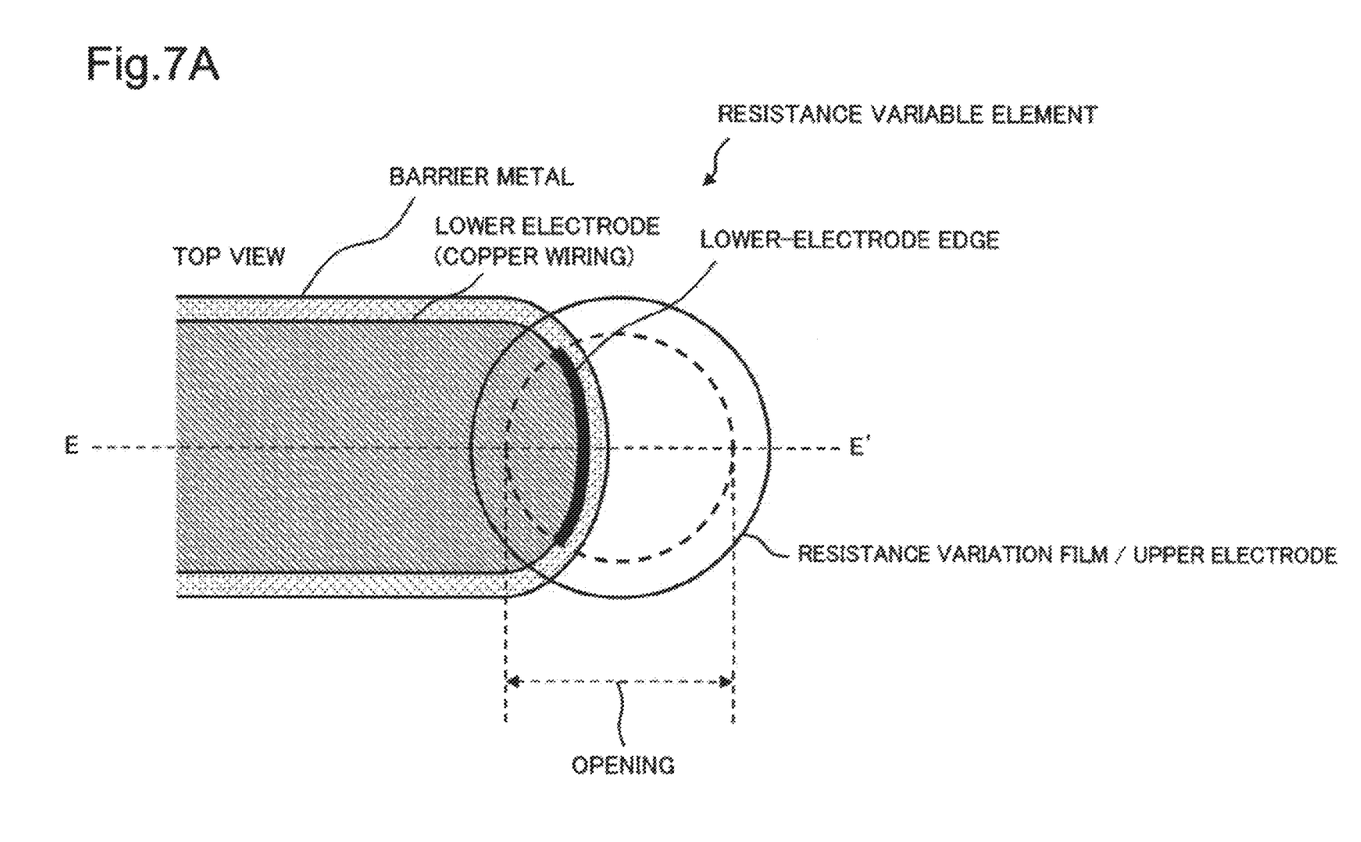
FIG. 7A is a top view for illustrating a configuration of a resistance variation element in PTL 2.
Figure 7B:
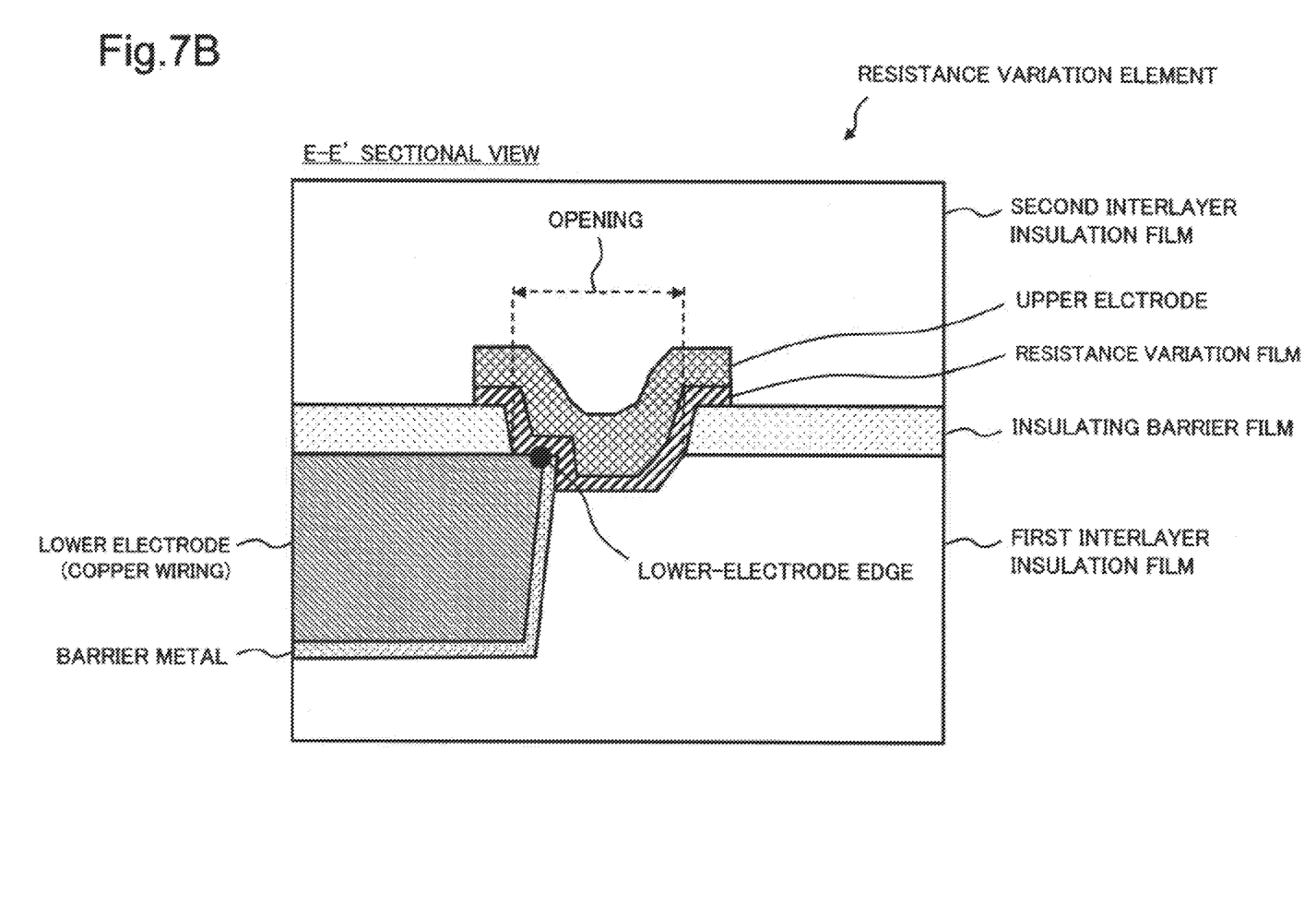
FIG. 7B is a sectional view for illustrating the configuration of the resistance variation element in PTL 2.

FIG. 7A illustrates a top view for a resistance variation element being a solid electrolyte switch disclosed in PTL 2. FIG. 7B illustrates a sectional view at a position E-E' in the top view of FIG. 7A. The resistance variation element includes a lower electrode being an active electrode that supplies metallic ions, a resistance variation film being an ion conductive layer, and an upper electrode being an inert electrode that does not supply metallic ions.

As the lower electrode, copper wiring embedded in a first interlayer insulation film through intermediation of a barrier metal can be used. The lower electrode and the first interlayer insulation film are covered with an insulating barrier film, and the insulating barrier film has an opening from which a top end portion of the lower electrode is exposed. The resistance variation film is brought into contact with the lower electrode at the opening of the insulating barrier film, and covers the insulating barrier film in the periphery of the opening. The upper electrode is laminated on the resistance variation film. A second interlayer insulation film is formed on the insulating barrier film, and the second interlayer insulation film covers the resistance variation film and the upper electrode.

According to the above-mentioned structure, the lower electrode faces the upper electrode at a lower-electrode edge on the top end portion of the lower electrode. In the edge, an electric field is concentrated. Thus, by providing the edge to the electrode, concentration of the electric field promotes ionization of the electrode metal, and reduction in switching voltage and reduction in fluctuation of the switching voltage can be achieved.

In the structure in PTLs 2 to 5, at least either one of the electrodes has such a shape as the edge that the electric field is concentrated, and faces the other electrode at the edge, thereby the switching voltage and fluctuation thereof are reduced.

CITATION LIST

Patent Literature

[PTL 1] Japanese Unexamined Patent Application Publication No. 2005-101535
[PTL 2] International Publication No. WO 2013/136798
[PTL 3] Japanese Unexamined Patent Application Publication No. 2011-146632
[PTL 4] International Publication No. WO 2014/057734
[PTL 5] International Publication No. WO 2016/084349

Non Patent Literature

[NPL 1] S. Kaeriyama et al., "A Nonvolatile Programmable Solid-Electrolyte Nanometer Switch", IEEE Journal of Solid-State Circuits, Vol. 40(1), pp. 168-176, (2005).

SUMMARY OF INVENTION

Technical Problem

However, the technique disclosed in PTLs 1 to 5 and NPL 1 has a problem described below. Specifically, for a demand for increase in scale of the switch by microfabricating and integrating the resistance variation element at a high density, further reduction in switching voltage and reduction in fluctuation of the switching voltage are required. The technique disclosed in PTLs 1 to 5 and NPL 1 is an insufficient solution for the demand for reduction in switching voltage and reduction in fluctuation of the switching voltage at the time of increasing a scale of the switch, and further improvement is required.

The present invention has been made in view of the above-mentioned problem, and has an object to provide a resistance variation element of a metallic crosslink type, which reduces switching voltage and fluctuation thereof and is suitable for a highly dense integration.

Solution to Problem

A resistance variation element according to the present invention includes a resistance variation film of a metal depositing type, a first electrode which contacts with a first surface of the resistance variation film in a predetermined first region and supplies metallic ions via the first region, and a second electrode which is laminated on a second surface of the resistance variation film, wherein the first region includes a recessed region surrounded by a simple closed curve or a region surrounded by each of a plurality of simple closed curves, a line segment which passes through a point outside of the first region, ends of which exist on the simple closed curve, and each point of which in the vicinity of both the ends other than both the ends is outside of the first region, exists, and an edge of the first electrode is formed in a part of the simple closed curve including both the ends.

A semiconductor device according to the present invention includes a semiconductor integrated circuit having multilayer copper wiring, and the semiconductor integrated circuit incorporates the resistance variation element according to the present invention into the multilayer copper wiring.

A manufacturing method for a resistance variation element according to the present invention, includes exposing a predetermined first region of a first electrode, which is embedded in a first insulation film and supplies metallic ions, to an opening of a second insulation film covering the first insulation film, so that the first region includes a recessed region surrounded by a simple closed curve or a region surrounded by each of a plurality of simple closed curves, and so that a line segment which passes through a point outside of the first region, ends of which exist on the simple closed curve, and each point of which in a vicinity of both the ends other than both the ends is outside of the first region, and an edge of the first electrode in a part of the simple closed curve including both the ends, laminating a resistance variation film of a metallic depositing type on a first surface of the resistance variation film by covering the opening and being held in surface contact with the first electrode in the first region, and laminating a second electrode on a second surface of the resistance variation film.

Advantageous Effects of Invention

According to the present invention, a resistance variation element of a metallic crosslink type, which reduces switching voltage and fluctuation thereof and is suitable for a highly dense integration, can be provided.

EXAMPLE EMBODIMENT

Now, with reference to the drawings, details of example embodiments of the present invention are described. However, in the following example embodiments, limitations that are technically preferable for carrying out the present invention are given, and the scope of the present invention is not limited to the following.

First Example Embodiment

Figure 1A:
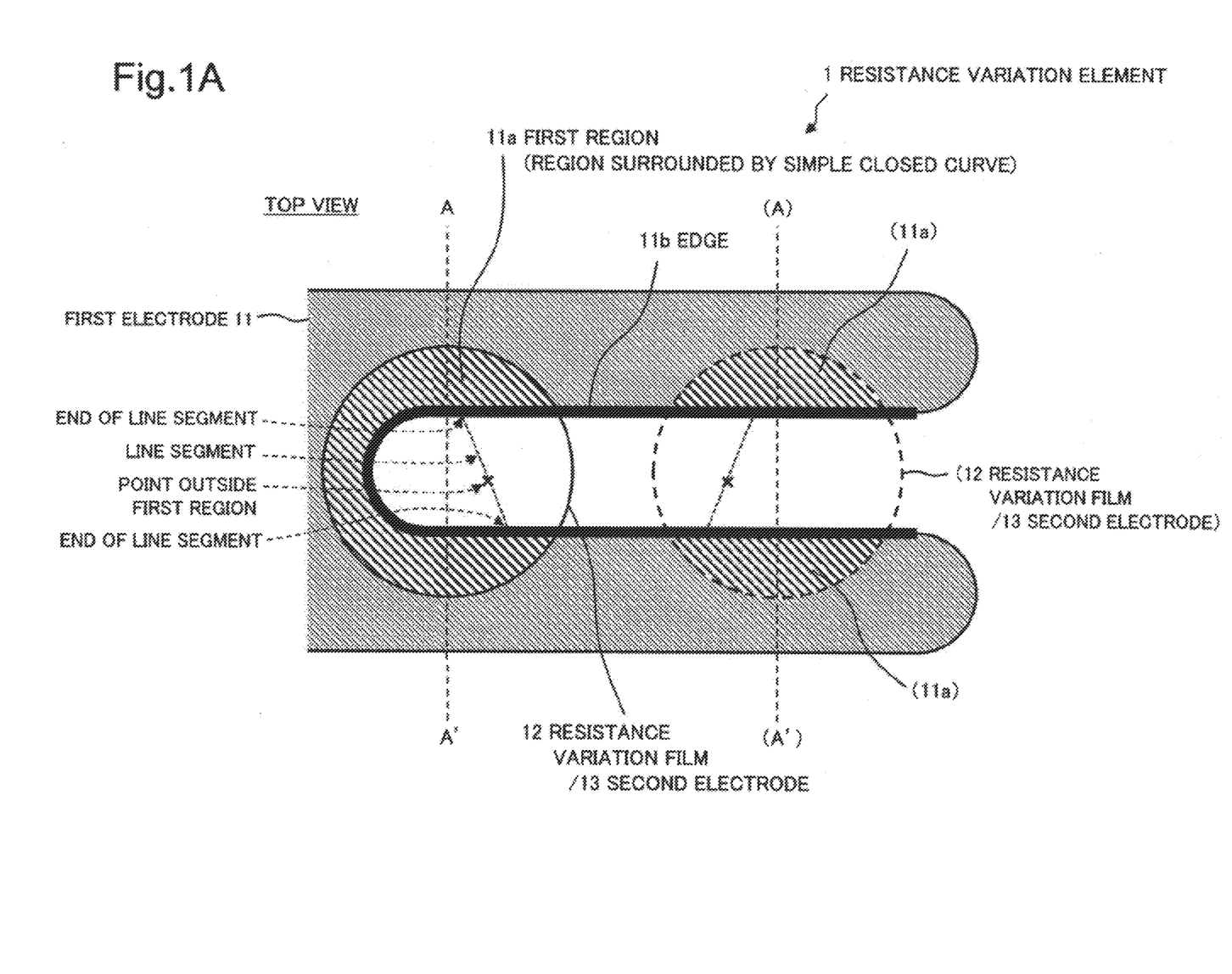
FIG. 1A is a top view for illustrating a configuration of a resistance variation element according to a first example embodiment of the present invention.
Figure 1B:
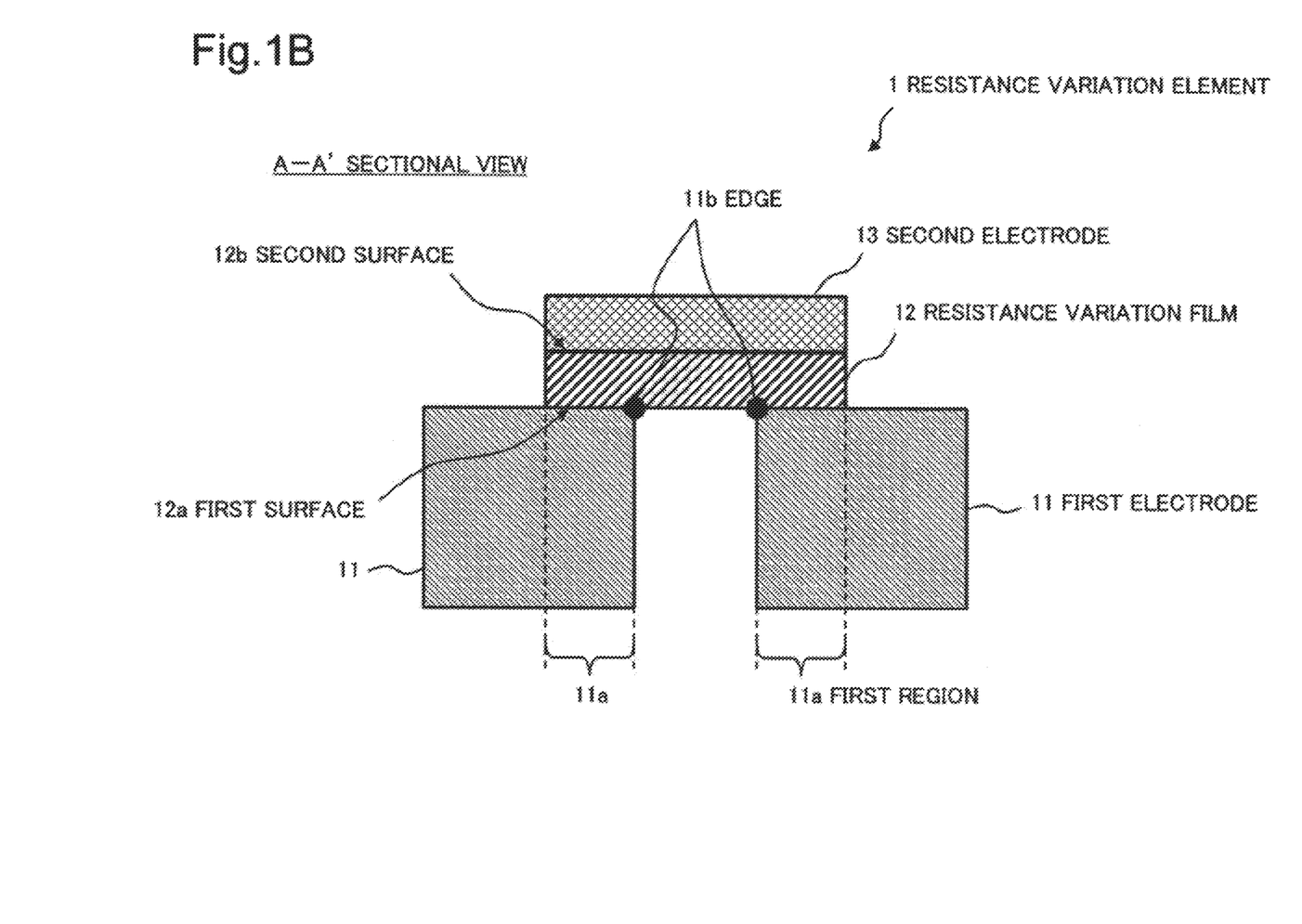
FIG. 1B is a sectional view for illustrating the configuration of the resistance variation element according to the first example embodiment of the present invention.

FIG. 1A is a top view for illustrating a configuration of a resistance variation element 1 according to a first example embodiment of the present invention. Further, FIG. 1B is a sectional view taken along at the position A-A' of the top view of FIG. 1A.

The resistance variation element 1 includes a resistance variation film 12 of a metal depositing type, a first electrode 11, which contacts with a first surface 12a of the resistance variation film 12 in a predetermined first region 11a and supplies metallic ions via the first region 11a, and a second electrode 13, which is laminated on a second surface 12b of the resistance variation film 12. Further, the first region 11a includes a recessed region surrounded by a simple closed curve or regions surrounded by each of a plurality of simple closed curves. Further, there exists a line segment, which passes through a point outside of the first region. The line segment has ends existing on the simple closed curve, and each point of the line segment in the vicinity of both the ends other than both the ends is outside of the first region. An edge of the first electrode 11 is formed in the part of the simple closed curve including both the ends.

Figure 2:
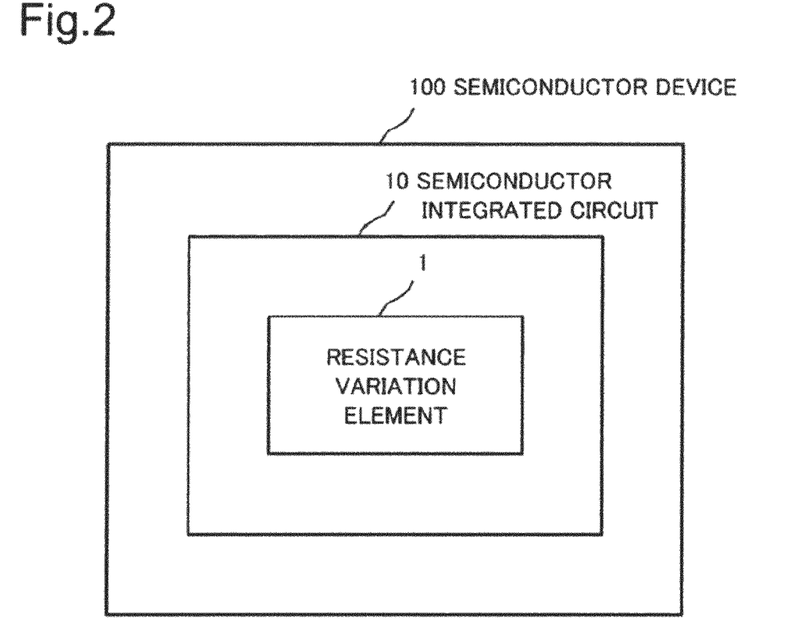
FIG. 2 is a block diagram for illustrating a configuration of a semiconductor device according to the first example embodiment of the present invention.

FIG. 2 is a block diagram for illustrating a configuration of a semiconductor device 100 according to the present example embodiment. The semiconductor device 100 includes a semiconductor integrated circuit 10 having multilayer copper wiring, and the semiconductor integrated circuit 10 incorporates the resistance variation element 1 into the multilayer copper wiring.

According to the present example embodiment, an edge 11b of the first electrode 11 faces the second electrode 13 across the resistance variation film 12. With this, as compared to the known configuration illustrated in FIG. 7A, the edge facing the second electrode 13 can be increased in length. As a result, a metallic crosslink is formed at a position of the long edge at which an electric field is concentrated the most, and hence switching is more likely to be performed with lower voltage. With this, the switching voltage is likely to be concentrated on the low voltage side, and the switching voltage and fluctuation thereof are reduced.

Further, the recessed part of the recessed simple closed curve or the parts between the plurality of simple closed curves are not exposed to light at the time of exposure for a positive resist, which is advantageous in forming a fine pattern, and hence it is possible to be formed to have a width smaller than a minimum dimension of exposure. This matter enables the resistance variation film 12 and the second electrode 13 over the edge to be microfabricated more likely, and thereby, is suitable for the demand microfabricating and integrating the element at a high density and increasing a scale of the switch.

As described above, according to the present example embodiment, the resistance variation element of a metallic crosslink type, which reduces switching voltage and fluctuation thereof and is suitable for a highly dense integration, can be provided.

Second Example Embodiment

Figure 3A:
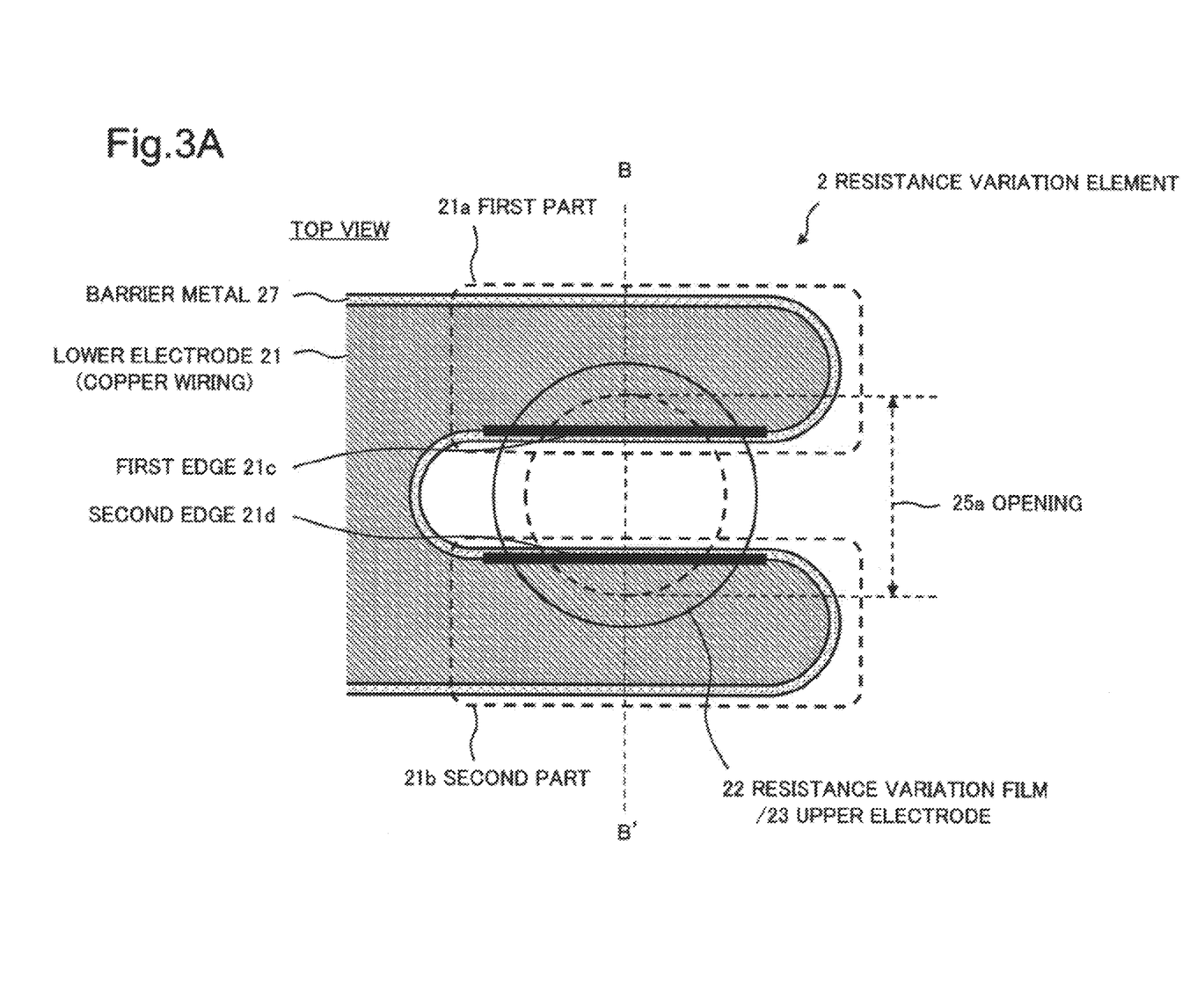
FIG. 3A is a top view for illustrating a configuration of a resistance variation element according to a second example embodiment of the present invention.
Figure 3B:
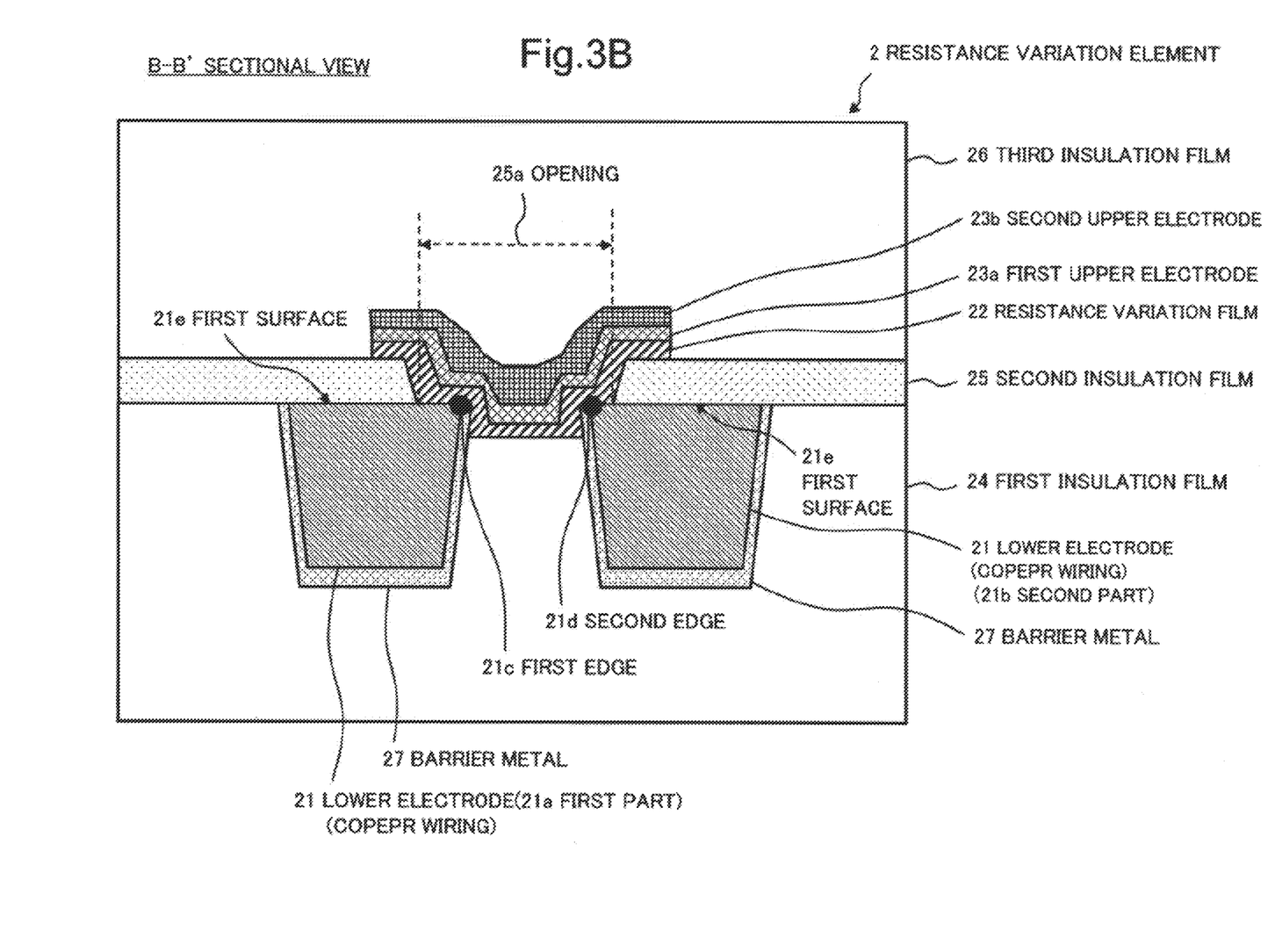
FIG. 3B is a sectional view for illustrating the configuration of the resistance variation element according to the second example embodiment of the present invention.

FIG. 3A is a top view for illustrating a configuration of a resistance variation element 2 according to a second example embodiment of the present invention. Further, FIG. 3B is a sectional view taken along at the position B-B' of the top view of FIG. 3A.

The resistance variation element 2 includes a lower electrode 21 that supplies metallic ions, a resistance variation film 22 of a metal depositing type, and an upper electrode 23. The upper electrode 23 has a laminated structure including a first upper electrode 23a and a second upper electrode 23b. Further, the resistance variation element 2 includes a first insulation film 24 in which the lower electrode 21 is embedded through intermediation of a barrier metal 27, a second insulation film 25 that covers the first insulation film 24 and has an opening 25a, and a third insulation film that covers the second insulation film 25, the resistance variation film 22, and the upper electrode 23. The opening 25a of the second insulation film 25 may be opened to have an inclination surface.

The lower electrode 21 is embedded in the first insulation film 24. Further, the lower electrode 21 has a first surface 21e corresponding to a top. Further, the lower electrode 21 has a first part 21a having a first edge 21c on the first surface 21e, and a second part 21b, which is adjacent to the first part 21a and has a second edge 21d facing the first edge 21c on the first surface 21e. The first edge 21c and the second edge 21d face a part between the first part 21a and the second part 21b that are adjacent to each other. Further, the first surface 21e having at least part of each of the first edge 21c and the second edge 21d is exposed to the opening 25a of the second insulation film 25 covering the first insulation film 24.

It is preferred that each of the first edge 21c and the second edge 21d is linear. When the first edge 21c and the second edge 21d are linear, management at the time of processing can be facilitated, and accuracy of the processing can be improved. Note that each of the first edge 21c and the second edge 21d are not limited to be linear, and may be curved.

Further, it is preferred that the first edge 21c and the second edge 21d is provided in such a way as to be linear and parallel to each other. When the first edge 21c and the second edge 21d are provided in such a way as to be linear and parallel to each other, management at the time of processing can be facilitated, and accuracy of the processing can be improved. Note that the first edge 21c and the second edge 21d are not limited to be provided in such a way as to be parallel to each other, and may be provided in such a way as to be substantially parallel to each other or incline with each other. The case being substantially parallel includes a case of being deviated from a parallel state due to fluctuation or processing accuracy at the time of processing such as etching.

The resistance variation film 22 covers the opening 25a, and is contact with the first surface 21e exposed to the opening 25a. The upper electrode 23 is laminated on the resistance variation film 22, and faces the first edge 21c and the second edge 21d at the opening 25a through intermediation of the resistance variation film 22.

The first insulation film 24 is an insulation film formed on a semiconductor substrate such as silicon on which a transistor and the like are formed. As the first insulation film 24 and the third insulation film 26, silicon oxide ($SiO_2$) or a material acquired by adding hydrogen or carbon to silicon oxide having a lower permittivity may be used. Further as the second insulation film, silicon carbonitride (SiCN) may be used. Note that the first insulation film 24, the second insulation film 25, and the third insulation film 26 are not limited to the above-mentioned materials.

The lower electrode 21 is an active electrode that supplies metallic ions to the resistance variation film 22. Copper may be used for the lower electrode 21. Further, the lower electrode 21 may contain copper as a main component and Ti, Al, Mn, W, Mg, and the like as an additive. The barrier metal 27 prevents the metal of the lower electrode 21 from being dispersed in the first insulation film 24. As the barrier metal 27, Ta, tantalum nitride, and a laminated film of one of those can be used. For the lower electrode 21 and the barrier metal 27, multilayer copper wiring, which is provided in a semiconductor integrated circuit included in a semiconductor device, can be used.

The resistance variation film 22 is a solid electrolyte material, and an oxide, a sulfide, an organic substance, and the like can be used. For example, an oxide containing Al, Ti, Ta, Si, Hf, Zr, or the like, a chalcogenide compound containing Ge, As, TeS, or the like, and an organic polymer film containing carbon, oxygen, and silicon can be used. Further, a laminated film of one of those may be used.

The upper electrode 23 is an inert electrode that does not supply metallic ions to the resistance variation film 22. Because of this, as the first upper electrode 23a contacts with the resistance variation film 22, noble metal such as Ru and Pt can be used. Alternatively, with such noble metal as a main component, Ta, Ti, W, or the like may be contained. Further, as the second upper electrode 23b, Ta or the like can be used.

A manufacturing method for the resistance variation element 2 according to the present example embodiment is as in the following. First, a groove for forming the lower electrode 21 is formed in the first insulation film 24 by etching. Subsequently, on an inner wall of the groove, the barrier metal 27 is deposited by chemical vapor deposition (CVD), and the lower electrode 21 is deposited by metal plating. Then, the top of the first insulation film 24, the barrier metal 27, and the lower electrode 21 are leveled by chemical mechanical polishing (CMP), and the second insulation film 25 is deposited on the leveled surface by CVD.

Next, by forming the opening 25a in the second insulation film 25 by etching, the first surface 21e having at least part of each of the first edge 21c and the second edge 21d of the lower electrode 21 is exposed to the opening 25a. At this time, between the first part 21a and the second part 21b of the lower electrode 21, the top of the first insulation film 24 exposed to the opening 25a may be subjected to overetching and be lower than the first surface 21e.

Next, the resistance variation film 22 is covered with the opening 25a, and is deposited by sputtering. With this, the resistance variation film 22 contacts with the first surface 21e exposed to the opening 25a. Subsequently, the upper electrode 23 is laminated on the resistance variation film 22, and is deposited by spattering. With this, the upper electrode 23 faces the first edge 21c and the second edge 21d at the opening 25a. Then, the third insulation film 26 is deposited by CVD.

Note that, although not illustrated in FIG. 3B, the lower electrode 21 and the upper electrode 23 are connected to the copper wiring in the multilayer copper wiring in such a way as to be connected to a transistor formed on a semiconductor substrate. Further, as the lower electrode 21, part of the copper wiring in the multilayer copper wiring can be used.

In the manufacturing method described above, at the time of forming the lower electrode 21 embedded in the first insulation film through intermediation of the barrier metal 27, a multilayer copper wiring process using copper plating deposition used in a general semiconductor process can be used. Further, at the time of forming the respective insulation films and the opening, processing such as CVD deposition, photolithography, and dry etching, which are used in a general semiconductor process, can be used. Further, at the time of forming the resistance variation film 22 and the upper electrode 23, processing such as spattering deposition, photolithography, and dry etching, which are used in a general semiconductor process, can be used.

In the following, an operation of the resistance variation element 2 is described. Although not illustrated in FIG. 3A and FIG. 3B, the lower electrode 21 and the upper electrode 23 are connected to the multilayer copper wring on the silicon substrate on which a transistor and the like are formed, and in such a way as to be connected to the transistor and the like, and can be applied with positive or negative voltage or be grounded.

First, when the lower electrode 21 is grounded to apply negative voltage to the upper electrode 23, the metal of the lower electrode 21 is turned into metallic ions to be dissolved in the resistance variation film 22 being a solid electrolyte. The metallic ions in the resistance variation film 22 receive electrons at the upper electrode 23, and are turned into metal to be deposited. With the deposited metal, a metallic crosslink connecting the lower electrode 21 and the upper electrode 23 is formed in the resistance variation film 22. By electrically connecting the lower electrode 21 and the upper electrode 23 with each other with the metallic crosslink, an ON state is acquired.

The operation to acquire the ON state can be performed by grounding the upper electrode 23 to apply positive voltage to the lower electrode 21. This is because a potential difference between the lower electrode 21 and the upper electrode 23 in the case where the lower electrode 21 is grounded to apply negative voltage to the upper electrode 23, and a potential difference between the lower electrode 21 and the upper electrode 23 in the case where the upper electrode 23 is grounded to apply positive voltage to the lower electrode 21, are the same.

Meanwhile, when the lower electrode 21 is grounded to apply positive voltage to the upper electrode 23 in the ON state, the metal being the metallic crosslink is turned into metallic ions to be dissolved in the resistance variation film 22, and part of the metallic crosslink is interrupted. With this, the lower electrode 21 and the upper electrode 23 are electrically disconnected, and an OFF stat is acquired. Note that, at the stage before the electrical connection is completely interrupted, changes in electrical properties, such as increasing in resistance between the lower electrode 21 and the upper electrode 23 or change in capacitances between the electrodes, are caused, and the electrical connection is interrupted in the end.

The operation to acquire the OFF state can be performed by grounding the upper electrode 23 to apply negative voltage to the lower electrode 21. This is because a potential difference between the lower electrode 21 and the upper electrode 23 in the case where the lower electrode 21 is grounded to apply positive voltage to the upper electrode 23, and a potential difference between the lower electrode 21 and the upper electrode 23 in the case where the upper electrode 23 is grounded to apply negative voltage to the lower electrode 21, are the same.

Further, in order to switch from the OFF state to the ON state, it is only required again to ground the lower electrode 21 to apply negative voltage to the upper electrode 23, or to ground the upper electrode 23 to apply positive voltage to the lower electrode 21.

In the operation described above, according to the resistance variation element 2, the two edges including the first edge 21c and the second edge 21d, which are provided to the first surface 21e of the lower electrode 21, face the upper electrode 23. With this, as compared to the case where the one edge faces the upper electrode as in the known configuration illustrated in FIG. 7A, the edge at which the electric field is concentrated can be increased in length. As a result, a metallic crosslink is formed at a position of the long edge at which an electric field is concentrated the most, and hence switching is more likely to be performed with lower voltage. With this, the switching voltage is likely to be concentrated on the low voltage side, and the switching voltage and fluctuation thereof are reduced.

Further, the part between the first part 21a and the second part 21b is not exposed to light at the time of exposure for a positive resist, which is advantageous in forming a fine pattern, and hence it is possible to be formed to have a width smaller than a minimum dimension to be able to exposure. This matter enables the resistance variation film 22 and the upper electrode 23 over the first edge 21c and the second edge 21d to be microfabricated more likely, and thereby, is suitable for the demand microfabricating and integrating the element at a high density and increasing a scale of the switch.

Note that, in the description above, the case where the lower electrode 21 has the two parts, which are the first part 21a and the second part 21b, is described, but the present example embodiment is not limited there to. In the present example embodiment, the lower electrode 21 can have a plurality of, two or more, parts.

Figure 4A:
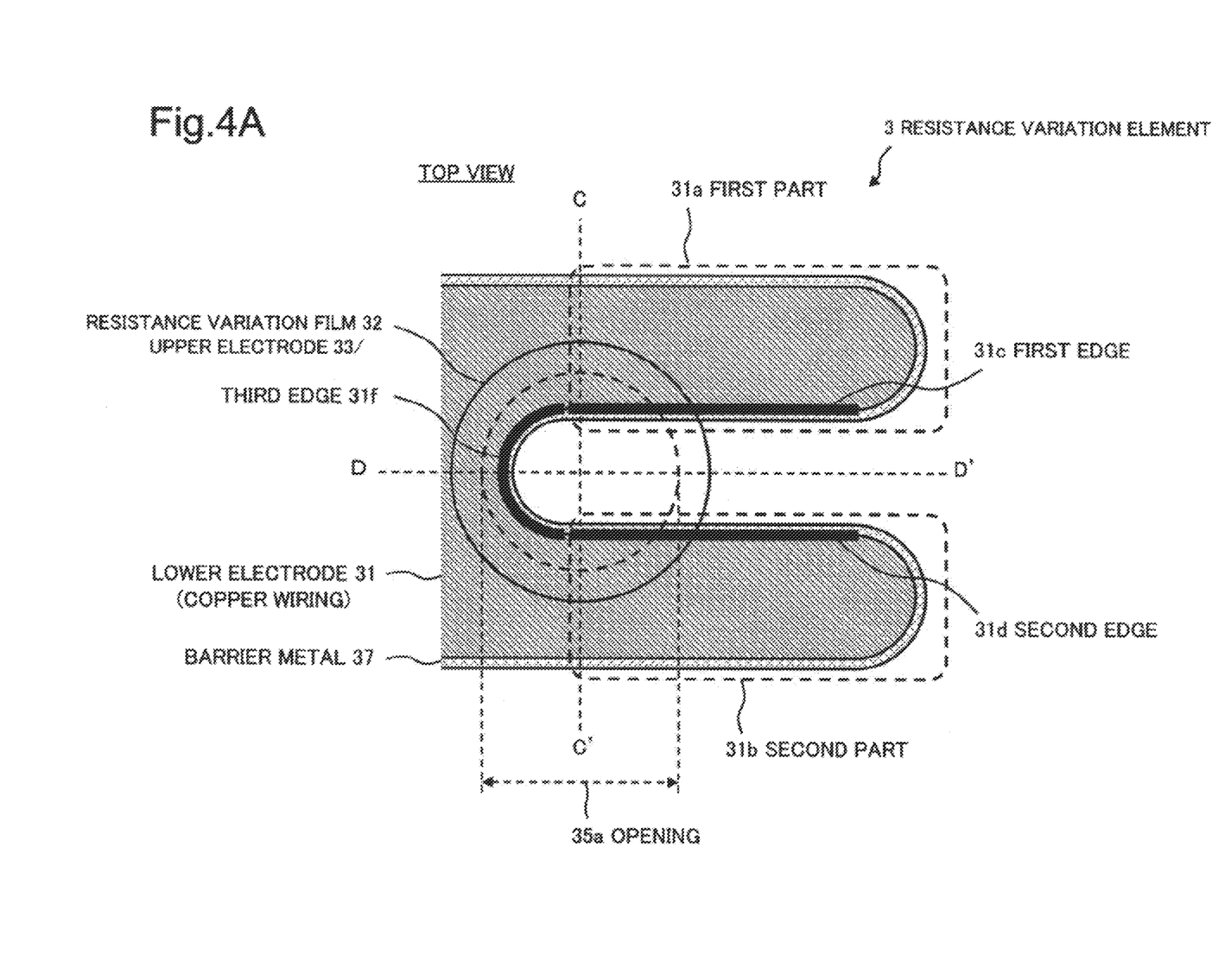
FIG. 4A is a top view for illustrating another configuration of the resistance variation element according to the second example embodiment of the present invention.
Figure 4B:
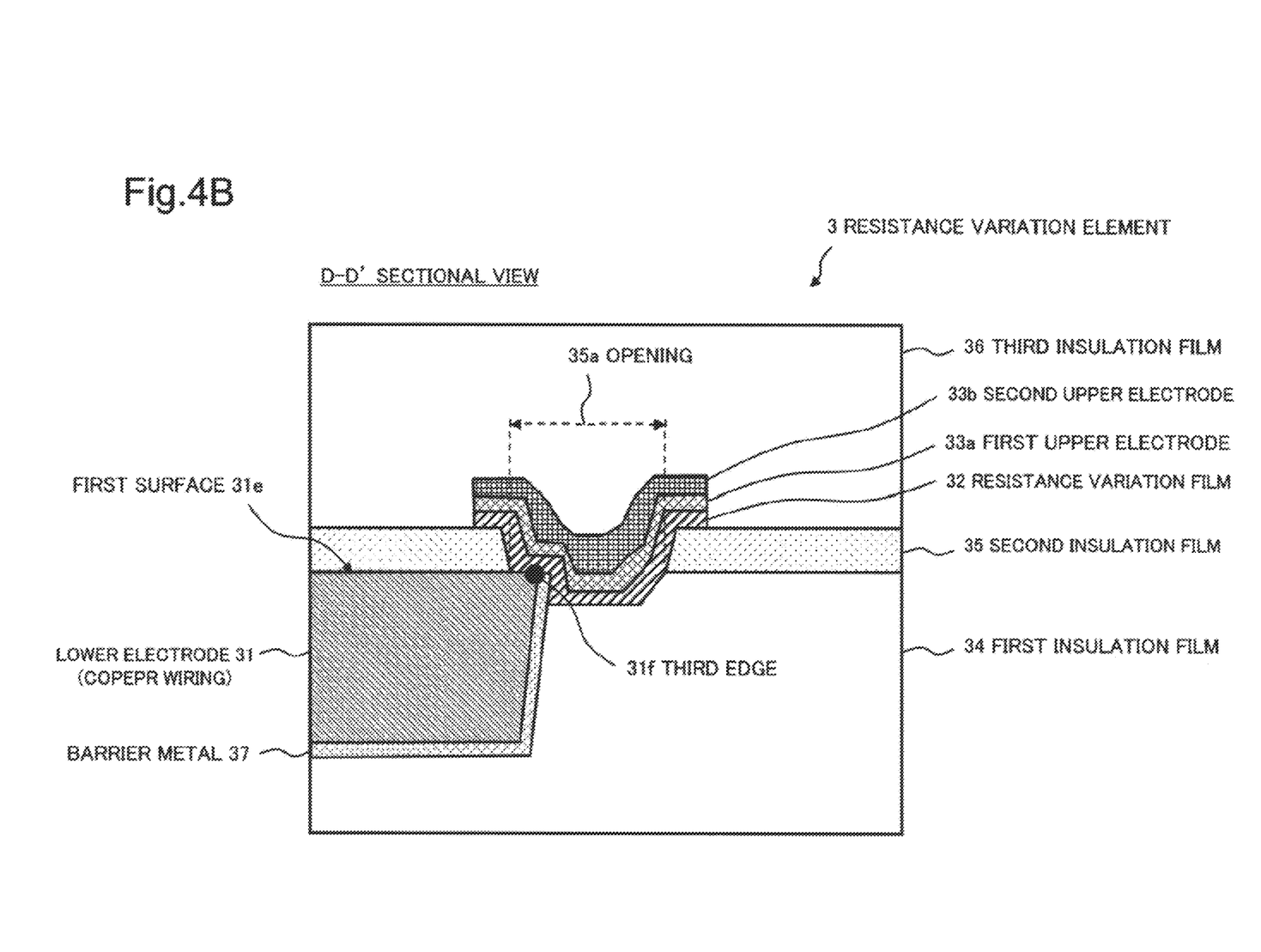
FIG. 4B is a sectional view for illustrating another configuration of the resistance variation element according to the second example embodiment of the present invention.

FIG. 4A is a top view for illustrating another configuration of a resistance variation element 3 according to the present example embodiment. Further, FIG. 4B is a sectional view taken along at the position D-D' of the top view of FIG. 4A. The cross section taken along at the position C-C' of the top view of FIG. 4A is the same as the cross section taken along at the position B-B' of FIG. 3A, which is illustrated in FIG. 3B.

The resistance variation element 3 is different from the resistance variation element 2 in that, in the resistance variation element 3, a lower electrode 31 includes a third edge 31f, which is connected to a first edge 31c and a second edge 31d on a first surface 31e and is exposed to an opening 35a. Further, an upper electrode 33 including a first upper electrode 33a and a second upper electrode 33b faces the third edge 31f at the opening 35a.

Other constituents of the resistance variation element 3, that is, a first part 31a, a second part 31b, the first edge 31c, the second edge 31d, and the first surface 31e of the lower electrode 31, a resistance variation film 32, a first insulation film 34, a second insulation film 35, a third insulation film 36, and a barrier metal 37 are the same as the corresponding constituents of the resistance variation element 2.

As compared to the resistance variation element 2, the edge at which an electric field is concentrated is increased in length because, in the resistance variation element 3, the third edge 31f is exposed to the opening 35a and corresponds to the upper electrode 33. As a result, a metallic crosslink is formed at a position of the long edge at which an electric field is concentrated the most, and hence switching is more likely to be performed with lower voltage. With this, the switching voltage is likely to be concentrated on the low voltage side, and the switching voltage and fluctuation thereof are reduced.

It is preferred that the shape of the third edge 31f is a curve such as an arc. The far part of the dead end as illustrated in FIG. 4A can be easily processed into a curve, and hence processing can be facilitated when the shape of the third edge 31f is an arc and the like. Note that the shape of the third edge 31f is not limited to a curve, and may be linear.

A manufacturing method for the resistance variation element 3 according to the present example embodiment is as in the following. First, the first surface 31e, which has at least part of each of the first edge 31c and the second edge 31d, and the third edge 31f, of the lower electrode 31, which is embedded in the first insulation film 34 through intermediation of the barrier metal 37, is exposed to the opening 35a of the second insulation film 35.

Subsequently, the resistance variation film 32 is deposited in such a way as to cover the opening 35a. With this, the resistance variation film 32 is contact with the first surface 31e exposed to the opening 35a. Next, the upper electrode 33 is laminated on the resistance variation film 32, and is deposited. With this, the upper electrode 33 faces the first edge 31c, the second edge 31d, and the third edge 31f at the opening 35a. Then, the third insulation film 36 is deposited.

In the manufacturing method described above, similarly to the manufacturing method for the resistance variation element 2, a general semiconductor process can be used for forming the lower electrode 31, the resistance variation film 32, the upper electrode 33, and the respective insulation films.

Figure 5:
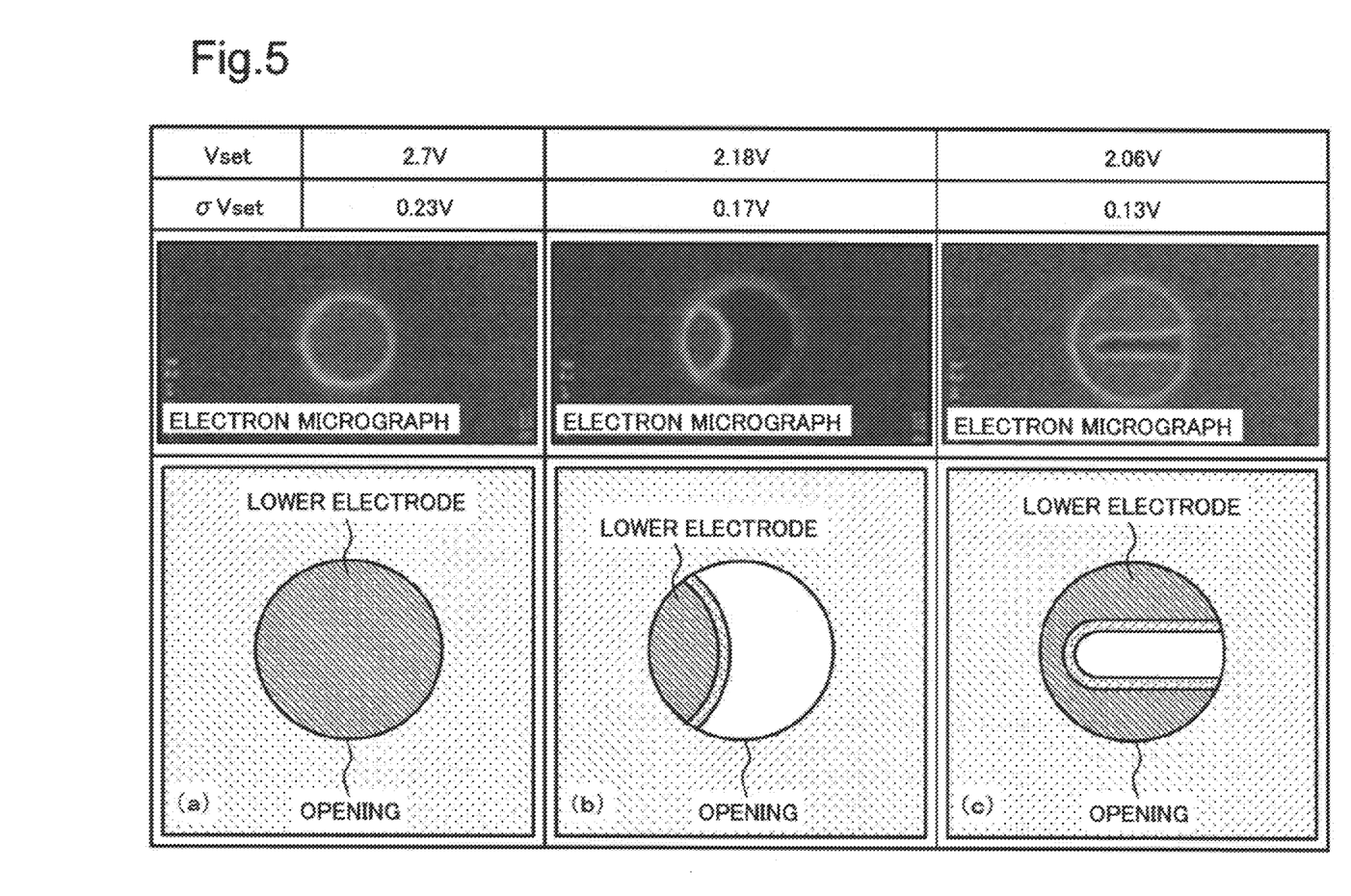
FIG. 5 is a diagram for illustrating effects of the resistance variation element according to the second embodiment of the present invention.

FIG. 5 is a diagram for illustrating effects of the resistance variation element 3 according to the present example embodiment. In FIG. 5, comparison is made on a switching voltage of the resistance variation element (a set voltage Vset) and fluctuation of the switching voltage (σVset) at the time of changing a shape of the first surface of the lower electrode exposed to the opening of the second insulation film. The shape of the first surface of the lower electrode exposed to the opening of the second insulation film is as below: (a) a case where the first surface is exposed to the entire opening; (b) a case where the first surface is exposed as in PTL 2; and (c) a case where the first surface is exposed as the case of the resistance variation element 3. In FIG. 5, with regard to each of the cases (a), (b), and (c), an electron micrograph from the top and a schematic diagram thereof at the stage when the opening 35a of the second insulation film 35 is formed are given.

In the case (a), Vset and σVset are 2.7 V and 0.23 V, respectively. In the case (b), Vset and σVset are 2.18 V and 0.17 V, respectively. In the case (c), Vset and σVset are 2.06 V and 0.13 V, respectively. In this way, reduction in the switching voltage and fluctuation thereof at the resistance variation element 3 according to the present example embodiment is confirmed.

Figure 6:
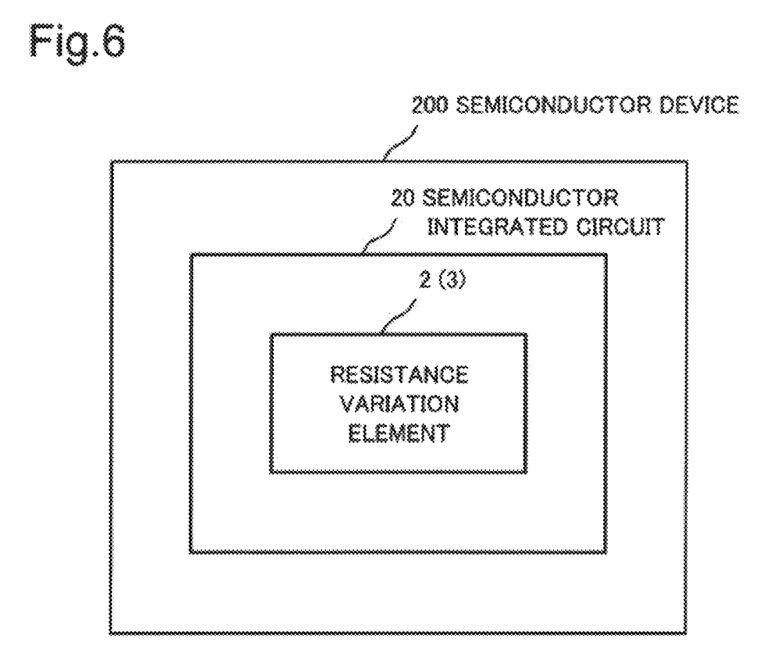
FIG. 6 is a block diagram for illustrating a configuration of a semiconductor device according to the second example embodiment of the present invention.

FIG. 6 is a block diagram for illustrating a configuration of a semiconductor device 200 according to the present example embodiment. The semiconductor device 200 includes a semiconductor integrated circuit 20 having multilayer copper wiring, and is a semiconductor device in which the resistance variation element 2 or 3 is incorporated into the multilayer copper wiring. The semiconductor device 200 can include the semiconductor integrated circuit 20 such as a memory circuit including a complementary metal oxide semiconductor (CMOS) or a bipolar transistor, a logic circuit such as a microprocessor, and a circuit to which those components are mounted at the same time.

Further, an electronic circuit device, an optical circuit device, a quantum circuit device, a micromachine, a micro electro mechanical systems (MEMS), and the like can be connected to the semiconductor device 200, and the resistance variation element according to the present example embodiment can be used as a switch at the time of connection. Further, other than the switch, the resistance variation element according to the present example embodiment can be used as a non-volatile memory.

According to the present example embodiment, the edge including the first edge, the second edge, and the third edge, provided on the first surface (top) of the lower electrode faces the upper electrode. With this, as compared to the known configuration illustrated in FIG. 7A, the edge at which the electric field is concentrated can be increased in length. As a result, a metallic crosslink is formed at a position of the long edge at which an electric field is concentrated the most, and hence switching is more likely to be performed with lower voltage. With this, the switching voltage is likely to be concentrated on the low voltage side, and the switching voltage and fluctuation thereof are reduced.

Further, the part between the first part and the second part is not exposed to light at the time of exposure for a positive resist, which is advantageous in forming a fine pattern, and hence it is possible to be formed to have a width smaller than a minimum dimension to be able to exposure. This matter enables the resistance variation film and the upper electrode over the first edge and the second edge to be microfabricated more likely, and thereby, is suitable for the demand microfabricating and integrating the element at a high density and increasing a scale of the switch.

According to the present example embodiment described above, the resistance variation element of a metallic crosslink type, which reduces switching voltage and fluctuation thereof and is suitable for a highly dense integration, can be provided.

The present invention is not limited by the above-mentioned example embodiments, and various changes can be made within the scope of the invention described in the scope of claims. Needless to say, those changes are included within the scope of the present invention.

This application is based upon and claims the benefit of priority from Japanese Patent Application No. 2016-252480, filed on Dec. 27, 2016, the disclosure of which is incorporated herein in its entirety by reference.

REFERENCE SIGNS LIST 1, 2, 3 Resistance variation element
10, 20 Semiconductor integrated circuit
100, 200 Semiconductor device
11 First electrode
11a First region
11b Edge
12 Resistance variation film
12a First surface
12b Second surface
13 Second electrode
21, 31 Lower electrode
21a, 31a First part
21b, 31b Second part
21c, 31c First edge
21d, 31d Second edge
21e, 31e First surface
31f Third edge
22, 32 Resistance variation film
23, 33 Upper electrode
24, 34 First insulation film
25, 35 Second insulation film
25a, 35a Opening
26, 36 Third insulation film
27, 37 Barrier metal

What is claimed is:

1. A resistance variation element, comprising:
a resistance variation film of a metal depositing type;
a first electrode which contacts with a first surface of the resistance variation film in a predetermined first region and supplies metallic ions via the first region; and
a second electrode laminated on a second surface of the resistance variation film, wherein
the first electrode having two half-straight parts that face each other in parallel, and a curved part that connects ends of the two half-straight parts to each other,
the resistance variation film is in contact with both of the two half-linear parts of the first electrode in the first region, and
an edge of the first electrode is formed at a portion where the first electrode and the resistance variation film are in contact with each other.

2. The resistance variation element according to claim 1, wherein
the first electrode is embedded in a first insulation film, and
the resistance variation film is provided in such a way as to cover an opening of a second insulation film which has the opening for exposing the first region of the first electrode and covers the first insulation film.

3. The resistance variation element according to claim 1, wherein the edge has a linear part.

4. The resistance variation element according to claim 1, wherein the edge has parts parallel to each other.

5. The resistance variation element according to claim 1, wherein the first electrode has copper wiring in multilayer copper wiring of a semiconductor integrated circuit.

6. A semiconductor device, comprising a semiconductor integrated circuit including multilayer copper wiring, wherein the semiconductor integrated circuit incorporates the resistance variation element according to claim 1 into the multilayer copper wiring.

7. A manufacturing method for forming a resistance variation element which includes a resistance variation film of a metal depositing type, a first electrode having two half-straight parts that face each other in parallel and a curved part that connects ends of the two half-straight parts to each other, and a second electrode, the method comprising:
exposing a predetermined first region of the first electrode, which is embedded in a first insulation film and supplies metallic ions, to an opening of a second insulation film covering the first insulation film, so that the resistance variation film is in contact with both of the two half-linear parts of the first electrode in the first region, and an edge of the first electrode is formed at a portion where the first electrode and the resistance variation film are in contact with each other;

laminating a resistance variation film of a metallic depositing type on a first surface of the resistance variation film by covering the opening and being held in surface contact with the first electrode in the first region; and laminating a second electrode on a second surface of the resistance variation film.

8. The manufacturing method for forming a resistance variation element according to claim 7, wherein the edge has a linear part.

9. The manufacturing method for forming a resistance variation element according to claim 7, wherein the edge has parts parallel to each other.

10. The manufacturing method for forming a resistance variation element according to claim 7, wherein the first electrode has copper wiring in multilayer copper wiring of a semiconductor integrated circuit.

* * * * *